United States Patent
Cuppens

(10) Patent No.: US 8,422,281 B2
(45) Date of Patent: Apr. 16, 2013

(54) VOLTAGE CONTROL CIRCUIT FOR PHASE CHANGE MEMORY

(75) Inventor: Roger Cuppens, Zonhoven (BE)

(73) Assignee: NXP B.V., Eindhoven (NL)

( * ) Notice: Subject to any disclaimer, the term of this patent is extended or adjusted under 35 U.S.C. 154(b) by 193 days.

(21) Appl. No.: 12/971,578

(22) Filed: Dec. 17, 2010

(65) Prior Publication Data

US 2011/0149644 A1   Jun. 23, 2011

(30) Foreign Application Priority Data

Dec. 18, 2009   (EP) ..................................... 09180010

(51) Int. Cl.
*G11C 11/00* (2006.01)
(52) U.S. Cl.
USPC .. 365/163; 365/148; 365/189.06; 365/189.07
(58) Field of Classification Search .................. 365/113, 365/34
See application file for complete search history.

(56) References Cited

U.S. PATENT DOCUMENTS

| | | | |
|---|---|---|---|
| 7,154,774 B2 * | 12/2006 | Bedeschi et al. | 365/163 |
| 7,190,607 B2 * | 3/2007 | Cho et al. | 365/148 |
| 7,920,405 B2 * | 4/2011 | Kang et al. | 365/148 |
| 2008/0151652 A1 | 6/2008 | Oh et al. | |
| 2009/0052227 A1 | 2/2009 | Edahiro et al. | |

FOREIGN PATENT DOCUMENTS

WO   2009122344 A1   10/2009

OTHER PUBLICATIONS

Extended European Search Report for Patent Appln. No. 09180010.2 (May 31, 2010).

* cited by examiner

*Primary Examiner* — Tan T. Nguyen

(57) ABSTRACT

The present invention relates to a voltage control circuit, semiconductor memory device, and method of controlling a voltage in a phase-change memory, wherein the voltage control circuit generates a controlled voltage which can be above the logic supply voltage. This voltage can limit the bit line voltage in a phase-change memory to allow the use of smaller transistors in the memory cells and in the program current part of the circuit. This results in smaller memory cells and modules.

11 Claims, 3 Drawing Sheets

VOLTAGE CONTROL CIRCUIT FOR PHASE CHANGE MEMORY

This application claims the priority under 35 U.S.C. §119 of European patent application no. 09180010.2, filed on Dec. 18, 2009, the contents of which are incorporated by reference herein.

FIELD OF THE INVENTION

The present invention relates to a voltage control circuit, a semiconductor memory device, and a method of controlling a voltage of a phase-change memory.

BACKGROUND OF THE INVENTION

Phase-change memories are non-volatile memories and can be seen as potential successors of flash memories for which scaling becomes more and more difficult. In phase-change memories, a resistor made from some chalcogenide material is used to store data. The resistor is programmed via a transition of the material's phase. Therefore, this memory type is mostly referred to as phase-change memory.

A memory cell of a phase-change memory may consist of a switching or selecting element and a resistor. The material of the resistor can be brought from a crystalline to an amorphous state or vice versa by heating. This can be achieved by forcing a current through the resistor. The material of the resistor may comprise an alloy of germanium, antimony and tellurium. Common names for phase-change memories are Chalcogenide Random Access Memory (CRAM), phase-change Memory (PCM), phase-change RAM (PRAM), or Ovonyx Unified Memory (OUM). The switching element can be a bipolar transistor or a diode or a metal oxide semiconductor (MOS) transistor. For applications embedded in a complementary MOS (CMOS) process, an n-type MOS transistor (nMOST) can be used as switching or selecting element.

To switch the resistor from a low-ohmic state (crystalline state) to a high-ohmic state (amorphous state), a current large enough to locally melt the resistor material is forced through the resistor and during fast cooling the melted material becomes amorphous resulting in a high-ohmic resistor. This state transfer can be called a "reset" operation. To switch the resistor from the high-ohmic state to the low-ohmic state, a voltage larger than a material dependent threshold voltage is applied over the high-ohmic resistor to transfer its state to a low-ohmic state, while some current needs to flow to heat the material and let is crystallize. However, this current needs to be lower than in the above reset operation to avoid melting of the material. This state change can be referred to as a set operation. For reading a memory cell of the phase-change memory, a voltage lower than the material threshold voltage of the set operation can be applied over the resistor and a current can be sensed or measured to determine if a first binary state (e.g. "1") which corresponds to a low resistor or a second binary state (e.g. "0") which corresponds to a high resistor was stored in a cell.

Maintaining these three discrete conditions (set, reset, read) within a matrix of a memory module and assuring that needed actions can be performed at a low voltage and in a short time (e.g. nanoseconds to tens of nanoseconds) and only for selected memory cell(s) is a challenging task.

If the phase-change memory cells need a large current for the reset operation, it has to pass through the selection transistor causing a voltage drop over that transistor. The logic supply voltage is low and tends to decrease in next process generations. For the set operation, a voltage larger than the material threshold has to be supplied over the resistor. This voltage can be larger than the minimum allowed logic supply voltage. To avoid that the selection transistor will dominate the size of the memory cell, the selection transistor needs to have the highest current drive capability in the smallest area, which can be achieved for example by a thin-oxide transistor with minimum gate-length. In this case, the bit line voltage in the memory has to be limited under all operating conditions. Furthermore, to avoid very large transistors in the program current path of the voltage controller or regulator, again thin gate-oxide transistors are desirable.

SUMMARY OF THE INVENTION

The present invention has been found useful in providing an improved phase-change memory, which allows a use of small-sized transistors to reduce the size of the memory cells.

In a first aspect of the present invention a voltage control circuit for a phase-change memory is presented, comprising:
comparator means (10) for comparing a voltage at a node of said phase-change memory with a reference voltage in a program mode of said phase-change memory and generating a controlled output voltage to be applied to a selection element (M13) for selecting said node; and
switching means (M10, M11, M12, M14) for forcing said controlled output voltage to a logic supply voltage in a read mode of said phase-change circuit.

In a further aspect of the present invention a method of controlling a voltage in a phase-change memory is presented, comprising:
comparing a voltage at a node of said phase-change memory with a reference voltage in a program mode of said phase-change memory;
generating based on the comparison result a controlled output voltage to be applied to a selection element for selecting said node; and
forcing said controlled output voltage to a logic supply voltage in a read mode of said phase-change circuit.

Accordingly, in the program mode, the voltage at a node in the circuit is controlled by comparing this voltage with a reference voltage. To control values above the logic supply voltage, controlling is done at a higher supply voltage. However, in the read mode, this control is not needed and the controlled voltage can be forced to the logic supply voltage via separate switching means (e.g. other transistors). Thereby, the voltage over the selection element (e.g. selection transistor or control transistor) can be limited so that it can be implemented as a thin gate-oxide transistor with minimum gate-length or any other transistor type with less space requirements.

The proposed voltage control approach can be used for example to clamp the bit line voltage of a phase-change memory so that the selection transistor of a memory cell and the control transistor which conducts the program current in the program mode can be thin-oxide devices. This provides the advantage that the memory module can be kept smaller, while a programmability of the clamping voltage can enhance the yield and reliability of the memory because this voltage can be individually adapted to compensate for phase-change threshold voltage variations.

The comparator means may be connected to a supply voltage higher than the logic supply voltage. Thereby, voltages above the logic supply voltage can be controlled.

Furthermore, the comparator means may comprise a differential amplifier. Such a differential amplifier can be realized with only four transistors, so that the space requirements can be kept low.

The switching means may comprise a first switching means for connecting the logic supply voltage to the node, and a second switching means for connecting the logic supply voltage to a control terminal of the selection element. These first and second switching means can be controlled in response to the operating mode of the phase-change memory, so that the voltage is limited in the read mode.

Additionally, the switching means may comprise third switching means for disconnecting the comparator means from a supply voltage. Thereby, power can be saved, since the control functionality is not needed in the read mode.

As an additional option, control means may be provided for controlling the reference voltage to a value higher than a logic supply voltage. Such a controllable or trimmable reference voltage can be used to advantageously program or control the clamping voltage, as mentioned above.

The controlled node may be arranged on a bit line of the phase-change memory.

Furthermore, the switching means may comprise thick-oxide transistors and the selection element may comprise a thin-oxide transistor.

It is noted that the voltage control circuit can be arranged as separate module, chip, or chip set provided for the phase-change memory, or may be integrated with the phase-change memory in a single chip or a chip set.

Preferred embodiments of the invention are defined in the dependent claims. It shall be understood that the voltage control circuit of claim 1 and the method of claim 12 have similar and/or identical preferred embodiments as defined in the dependent claims.

DETAILED DESCRIPTION OF THE INVENTION

The present invention is further elucidated by the following figures and examples, which are not intended to limit the scope of the invention. The person skilled in the art will understand that various embodiments may be combined.

BRIEF DESCRIPTION OF THE DRAWINGS

These and other aspects of the invention will be apparent from and elucidated with reference to the embodiment(s) described hereinafter. In the following drawings

DETAILED DESCRIPTION OF THE DRAWINGS

Figure 1:
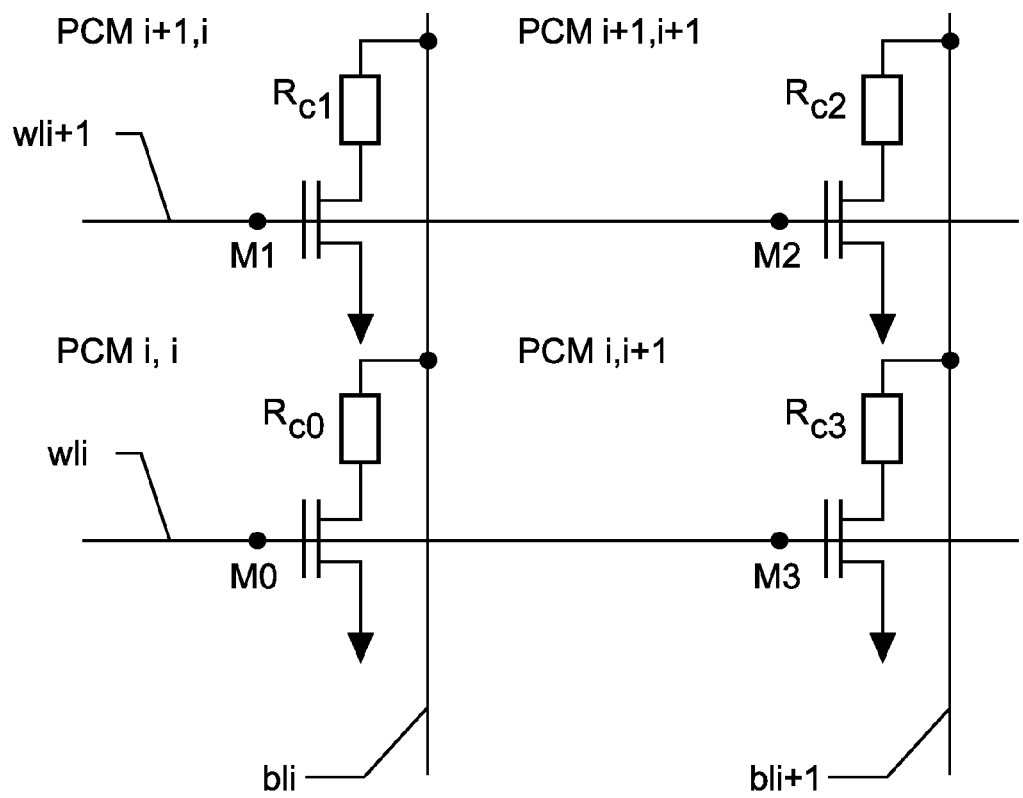
FIG. 1 shows a schematic circuit diagram of phase-change memory cells in a matrix organization.

FIG. 1 shows a schematic circuit diagram of a part of a phase-change memory matrix with four cells PCM i, i; PCM i+1, i; PCM i+1, i+1; and PCM i, i+1. The state of respective resistors $R_{c0}$ to $R_{c3}$ which are connected with their upper ends to bit lines bli and bli+1 can be controlled by corresponding selection transistors M0 to M3 having their control terminals connected to respective word lines bli, bli+1.

Since in the reset mode a selected cell needs to conduct a significant current (for example between 0.1 mA and 1 mA) the selection transistor (e.g. a MOST) needs to be sufficiently large dimensioned to limit its drain source voltage drop. However, to minimize the memory cell size, it is desirable that the selection transistors M0 to M3 can be realized as thin-oxide MOST with minimal gate-length or other small sized transistors. However, such transistors can only withstand a limited maximum voltage Vmax (for some time).

Furthermore, all non-selected cells in the selected bit line will have this bit line voltage between drain and source of their selection transistors. Thus, the level of this voltage has to be limited, too. In the set mode, a voltage above the threshold voltage needs to be applied over the selected resistor in the high resistor state. Since now the voltage drop over the selected selection transistor is very small, the bit line needs a voltage above this threshold voltage. The logic supply voltage (vdd) is allowed to vary within a certain range and the threshold voltage can also vary within the processed wafer and over the wafer. Consequently, the needed threshold voltage can be somewhat larger than the minimum supply voltage, which corresponds to the logic supply voltage (vdd), but has to be smaller than the maximum voltage Vmax. Optionally, further optimization can be reached by trimming the bit line voltage between the limits to allow individual chip setting for optimal operation.

According to various embodiments, to avoid the use of thick gate-oxide transistors in the current path of the phase-change memory and to reduce power consumption, for example in the read mode, a logic supply voltage needs to be supplied in the read mode, which keeps the voltage over the transistor in the current path below the maximum voltage Vmax, while cutting the current through a respective amplifier. In this way, the controlled voltage can act as a supply voltage for data input drivers and/or output drivers of the column selection, to transfer the almost constant bit line voltage to the bit line in the program mode independent if the selected cell sinks or draws a small or larger current. In this way, only one circuit per bit or even one circuit for all bits is needed in a memory module, so that extra chip area can be limited.

Figure 2:
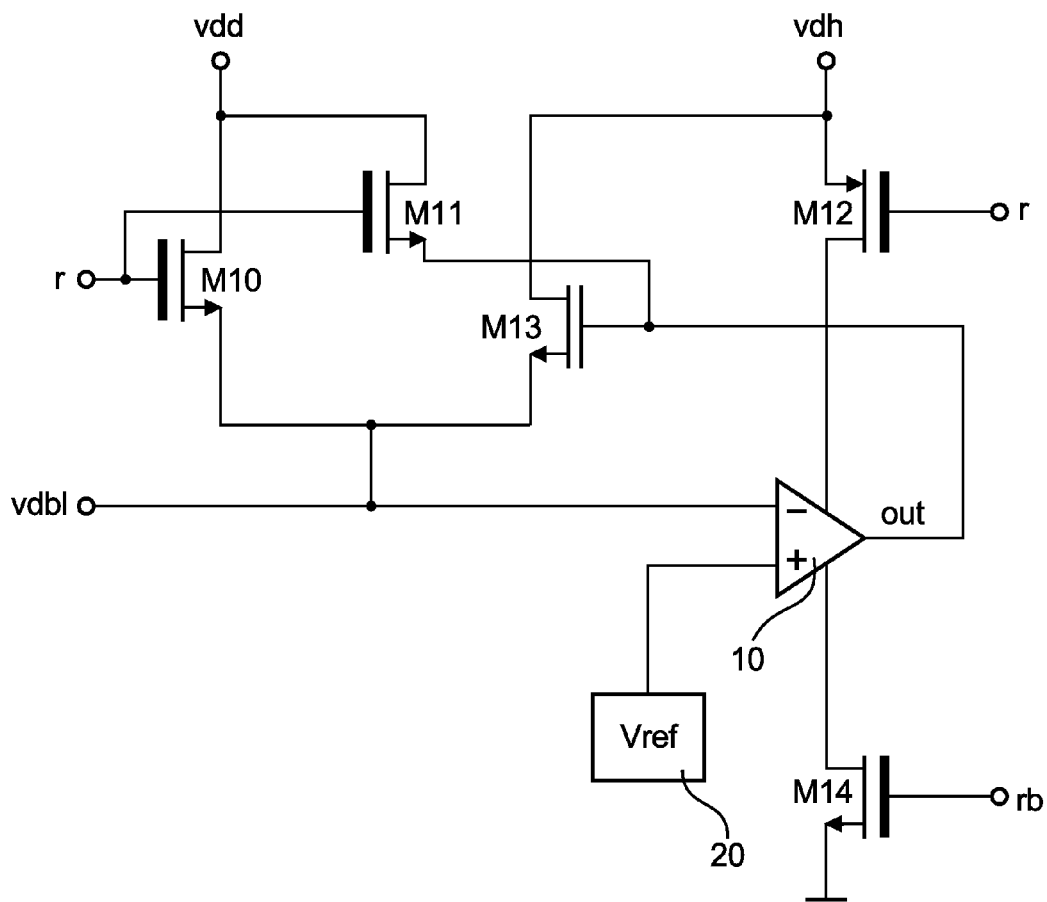
FIG. 2 shows a bit line voltage control circuit according to an embodiment of the present invention.

FIG. 2 shows a schematic circuit diagram of a bit line voltage control circuit. Here, transistor symbols drawn with a "thick gate" represent thick gate-oxide transistors that can withstand higher voltages.

According to the embodiment of FIG. 2, the controlled voltage (e.g. bit line voltage) is allowed to be larger than the logic supply voltage (in case the "set" threshold voltage is somewhat larger than the logic supply voltage). At the same time, non-selected cells of the matrix are protected from overvoltage (for an excessive time) without using thick gate-oxide transistors in a program current path. The latter ones would be very large due to the limited current drive capability of these transistors.

The voltage control circuit or voltage clamp circuit of FIG. 2 comprises a comparator 10 which may be implemented as a differential amplifier or any other comparator means which generate an output signal out which reflects the difference between the two input signals at the inverting and non-inverting input terminals. The bit line voltage vdbl is supplied to the inverting input of the comparator 10, while a reference voltage Vref is supplied to the non-inverting input. Modern logic processes or technologies can handle at least two different supply voltages: a normal logic supply voltage vdd (e.g. 1.2 V) and a higher so-called input/output (IO) supply voltage vdh (e.g. 2.5 V). In a circuit of FIG. 2, the bit line voltage vdbl can be controlled by the comparator output out to a voltage above the logic supply voltage vdd. This is possible, since the IO supply voltage vdh is supplied to the comparator 10.

The reference voltage Vref can be generated on the circuit chip or off the circuit chip and can be controlled or trimmed to a value above the logic supply voltage vdd in a corresponding voltage generator 20. In case it is controlled to value above the logic supply voltage vdd, the reference voltage generator 20 is supplied with the IO supply voltage vdh.

According to FIG. 2, a read signal r which may be at the level of the IO supply voltage vdh (e.g. after a level shifter) and an inverse read signal rb are supplied to control terminals of switching transistors M10, M12 and M14, respectively, to control operation of the voltage control circuitry in different operation modes of the phase-change memory.

In the program mode, the read signal r is set to a low binary state, so that the comparator 10 compares the bit line voltage vdbl with the reference voltage Vref and generates an output signal as long as the difference between the two input voltages is not zero. The output signal out is supplied to a control terminal of a feedback thin-oxide transistor M13 which increases the bit line voltage vdbl until the steady state has been reaches in the control loop generated via the feedback thin-oxide transistor 13. The size of the feedback thin-oxide transistor M13 and the level of the IO supply voltage vdh determine the current level, sunk from or drawn by the bit line voltage vdbl, up to which the bit line voltage vdbl still can be about equal to the reference voltage Vref. Consequently, in the program mode, all voltages seen by the feedback thin-oxide transistor M13 are below the voltage difference vdh–Vref.

In the read mode, the read signal is transferred or switched to a high binary state and the two switching transistors with M10 and M11 are switched to a low-ohmic state and the control terminal of the feedback thin-oxide transistor M13 and the bit line voltage vdbl are clamped or forced to the logic supply voltage vdd. Additionally, the transistors M12 and M14 are transferred to a high-ohmic state (which opened), so that the comparator 10 is cut off from its supply voltage. Thus, the current through the comparator 10 is cut off by the two transistors M12 and M14 and the bit line voltage vdbl and the output signal out of the comparator 10 are forced to the logic supply voltage vdd. It is noted that the transistors M10, M11, M12 and M14 may be any type of switching element or switching means which can be controlled by the read signals r and rb, respectively. In view of the space requirements, the switching means may be any type of controllable semiconductor switching element. In the read mode, the maximum voltage, seen by the thin-oxide transistor M13 is the difference vdh–vdd. This allows that the feedback thin-oxide transistor M13 (which will be in the current path during the program mode) to be a thin-oxide transistor.

Figure 3A:
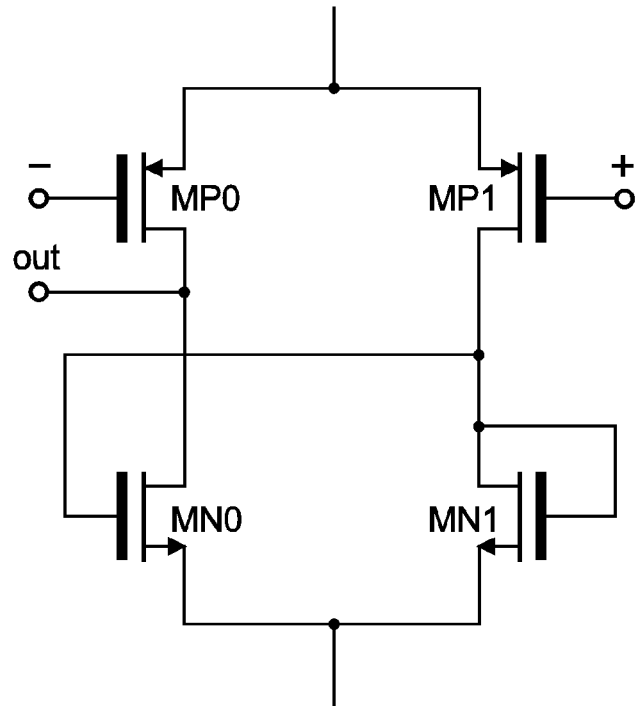
FIGS. 3A and 3B show examples of differential amplifier circuits which can be implemented in an embodiment.
Figure 3B:
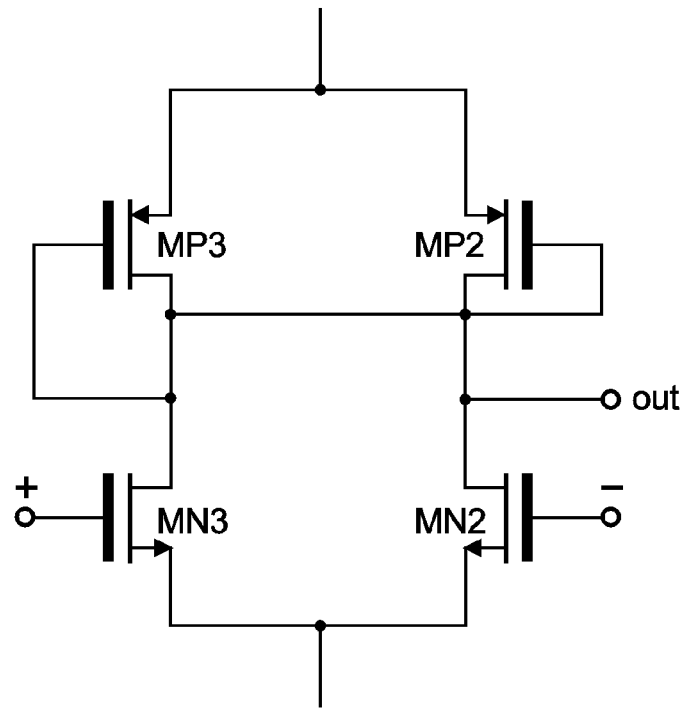

FIGS. 3A and 3B show examples of differential amplifier circuits which can be used to implement the comparator 10 in FIG. 2.

If one of the two switching transistors (e.g. MOSTs) M12 and M14 of FIG. 2 connected to the comparator 10 is dimensioned to act as a current source, the differential amplifier of the comparator 10 itself may consist out of only four transistors as depicted in FIGS. 3A and 3B.

FIG. 3A shows a circuit structure where the lower p-type transistor M14 of FIG. 2 acts as a current source. Similarly, in FIG. 3B, it is assumed that the upper n-type transistor M12 of FIG. 2 acts as a current source. Thus, in FIG. 3A, the lower two n-type transistors MN0 and MN1 are connected as a current mirror circuit to balance the branch currents of the upper two p-type transistors MP0 and MP1 of the differential circuit. In FIG. 3B, the upper two p-type transistors MP2 and MP3 are connected as current mirror to balance the two branch currents flowing through the differential circuit of the two n-type transistors MN2 and MN3.

Of course, other circuit options of differential amplifiers or comparator circuits can be used as well to implement the comparator 10 of FIG. 2. The solution depicted in FIGS. 3A and 3B leads to a small circuit area and thus little space requirements.

It is however noted that the above embodiments are not limited to a bit line voltage control circuitry. The principle can be used for controlling or clamping the voltage at any type of node at of a circuitry to release voltage and/or current requirements at semiconductor elements. The above embodiment can be used for phase-change memories in smart cards, microcontrollers or any other type of devices requiring non-volatile memory circuits. The embodiments may thus vary within the scope of the attached claims.

In summary, the present invention relates to a voltage control circuit, semiconductor memory device, and method of controlling a voltage in a phase-change memory, wherein the voltage control circuit generates a controlled voltage which can be above the logic supply voltage. This voltage can limit the bit line voltage in a phase-change memory to allow the use of smaller transistors in the memory cells and in the program current part of the circuit. This results in smaller memory cells and modules.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. A single item or other unit may fulfill the functions of several items recited in the claims. The mere fact that certain measures are recited in mutually different dependent claims does not indicate that a combination of these measures cannot be used to advantage.

A computer program may be stored/distributed on a suitable medium, such as an optical storage medium or a solid-state medium supplied together with or as part of other hardware, but may also be distributed in other forms, such as via the Internet or other wired or wireless telecommunication systems.

Any reference signs in the claims should not be construed as limiting the scope.

The invention claimed is:

1. A voltage control circuit for a phase-change memory, comprising:
   comparator means for comparing a voltage at a node of said phase-change memory with a reference voltage in a program mode of said phase-change memory and generating a controlled output voltage to be applied to a selection element (M13) for selecting said node; and
   switching means (M10, M11, M12, M14) for forcing said controlled output voltage to a logic supply voltage in a read mode of said phase-change circuit.

2. The voltage control circuit according to claim 1, wherein said comparator means is connected to a supply voltage higher than said logic supply voltage.

3. The voltage control circuit according to claim 1, wherein said comparator means comprises a differential amplifier.

4. The voltage control circuit according to claim 3 wherein said switching means (M10, M11, M12, M14) comprises third switching means (M12, M14) for disconnecting said comparator means (10) from a supply voltage.

5. The voltage control circuit according to claim 1, wherein said switching means (M10, M11, M12, M14) comprises first switching means (M10) for connecting said logic supply voltage to said node, and second switching means (M11) for connecting said logic supply voltage to a control terminal of said selection element (M13).

6. The voltage control circuit according to claim 1, further comprising control means for controlling said reference voltage to a value higher than said logic supply voltage.

7. The voltage control circuit according to claim 1, wherein said node is arranged on a bit line of said phase-change memory.

8. The voltage control circuit according to claim 1, wherein said switching means (M10, M11, M12, M14) comprise thick-oxide transistors and said selection element (M13) comprises a thin-oxide transistor.

9. A semiconductor memory device comprising:
   a voltage control circuit according to claim 1; and
   a plurality of phase-change variable resistors, each one of said plurality of phase-change variable resistors (Rc0-Rc3) comprising a first end connected to one of a plurality of bit lines and a second end connected to a selection element (M0-M3), wherein said selection element has a control terminal connected to a word line of said semiconductor memory device.

10. The semiconductor memory device according to claim 8, wherein said selection element (M0-M3) is a thin-oxide transistor.

11. A method of controlling a voltage in a phase-change memory, comprising:
   comparing a voltage at a node of said phase-change memory with a reference voltage in a program mode of said phase-change memory;
   generating based on the comparison result a controlled output voltage to be applied to a selection element for selecting said node; and
   forcing said controlled output voltage to a logic supply voltage in a read mode of said phase-change circuit.

* * * * *